United States Patent
Lauder et al.

[11] Patent Number: 6,130,823
[45] Date of Patent: Oct. 10, 2000

[54] STACKABLE BALL GRID ARRAY MODULE AND METHOD

[75] Inventors: Alan J. Lauder, Arlington; Simon G. Wood, Jr., Falls Church, both of Va.

[73] Assignee: Raytheon E-Systems, Inc., Falls Church, Va.

[21] Appl. No.: 09/240,623

[22] Filed: Feb. 1, 1999

[51] Int. Cl.$^7$ .................................................. H05K 1/18
[52] U.S. Cl. ........................ 361/760; 361/761; 361/764; 361/784; 257/686; 257/778; 395/494
[58] Field of Search ...................................... 361/760, 761, 361/764, 784, 803; 257/686, 778, 791; 395/494; 235/492, 487

[56] References Cited

U.S. PATENT DOCUMENTS

| | | | |
|---|---|---|---|
| 4,670,748 | 6/1987 | Williams | 340/825.84 |
| 5,013,900 | 5/1991 | Hoppe | 235/492 |
| 5,341,489 | 8/1994 | Heilberger et al. | 395/425 |
| 5,740,404 | 4/1998 | Baji | 395/494 |
| 5,766,982 | 7/1998 | Akram et al. | 438/51 |
| 5,783,870 | 7/1998 | Mostafazadeh et al. | 257/791 |
| 5,784,264 | 7/1998 | Tanioka | 361/803 |
| 5,977,640 | 11/1999 | Bertin et al. | 257/777 |
| 5,994,166 | 11/1999 | Akram et al. | 438/108 |

*Primary Examiner*—Jeffrey Gaffin
*Assistant Examiner*—David Foster
*Attorney, Agent, or Firm*—Rogers & Killeen

[57] ABSTRACT

A stackable ball grid array module in which a chip select decoder is used to reduce the number of busses required for communication between modules. Additional modules may be added without requiring additional interconnect lines in the array. Cooling of the individual modules may be accomplished using a support member made from an enhanced heat transfer material or placing an enhanced heat transfer material layer between the modules. The devices on the module may be encapsulated, and the modules may be constructed in a chip first or cavity-down configuration. Methods are also disclosed.

33 Claims, 1 Drawing Sheet

STACKABLE BALL GRID ARRAY MODULE AND METHOD

The present invention relates generally to a stackable ball grid array, and more specifically to a stackable ball grid array which uses a chip select decoder to reduce the number of intermodule busses required for communication with the array.

Stackable ball grid arrays are well known, and stackable ball grid arrays may be used with a wide variety of applications such as for RAM and parallel processing. Generally, stackable ball grid array modules may be used to increase the packaging density of electronic devices. The modules may be stacked vertically to reduce the surface area covered by such modules on a printed circuit board. This vertical stacking tends to reduce to overall size of an electronic system. Further, this vertical stacking reduces the physical distances between electronic devices which tends to reduce parasitic capacitance and inductance, and, in turn, to improve the signals between devices and reduce power consumption.

One known stackable ball grid array is disclosed in Mostafazadeh, et al. U.S. Pat. No. 5,783,870 dated Jul. 21, 1998. Conductive vias, balls, and interconnect pads form interconnect lines or busses which can be used to establish communication between the devices or modules in the stacked array. When additional devices or modules are added, more interconnect lines are required throughout the stack for addressing the additional modules or devices.

Several methods for stacking devices are described in Crowley, R. T. et al "3-D Multichip Packaging for Memory Modules" (Proceedings of the 1994 International Conference on Multichip Modules, pp. 474–479, April 1994). Devices have been stacked as bare die, with pads modified so that they extend to the edge of the device and interconnected by depositing electrically conductive traces along the sidewalls of the stacked device. Packaged parts have also been stacked and interconnected by molding a plastic cube around a stack of standard leaded packages, slicing the cube to expose the leads and then laser patterning a metal interconnecting layer on the cube. In still other methods, MCM lead frames are soldered together to form the vertical interconnect.

In all of the prior art modules know to applicants, some form of special processing is required to form the vertical interconnects and many of the known methods require careful handling of the bare die. In contrast, the present invention requires no special post processing, and the stack may be built using standard circuit board assembly techniques and the individual modules tested prior to assembly.

In one aspect, it is an object of the present invention to obviate many of the deficiencies of known modules and to provide a novel stackable ball grid array module and method which does not require additional interconnect lines when additional modules or devices are added to the array.

Moreover, typical prior stackable ball grid array modules are not identical, thus additional manufacturing costs may be associated with the production and use of nonidentical modules. In another aspect, it is an object of the present invention to obviate such costs and to provide a novel stackable ball grid array module and method in which the modules may be identical and the function(s) on a module to be used selected by the addressing of the module and the devices carried thereby, resulting in a significant cost saving.

Many stackable ball grid arrays are cooled by air, typically by the use of a fan or blower to force air through the array. Because the density of the array is generally quite high, such forced air methods are often not effective. This is particularly true when high power electronic devices are used in an array. In still another aspect, it is an object of the present invention to obviate the deficiencies of known forced air systems and to provide a novel stackable ball grid array module and method in which the substrates for the modules may be used as heat conductors to significantly improve the cooling of the array and the devices carried thereby.

For environmental reasons, it is often desirable to encapsulate the electronic devices within a stackable ball grid array, but encapsulation may create significant air flow and thus cooling problems. In yet another aspect, it is an object of the present invention to obviate the impediment of known forced air systems and to provide a novel encapsulated stackable ball grid array module and method in which the substrates for the modules may be used as heat conductors to improve the passage of heat from the array despite encapsulation.

Typically, a stackable ball grid array will electrically tie all the devices in the array together. However, not all of the electronic devices in an array may need to communicate with each other. The electric tying of all of the devices together requires additional and unnecessary interconnections between the modules and the devices carried thereby. This in turn increases manufacturing costs. In yet still another aspect, it is an object of the present invention to obviate such costs and to provide a novel stackable ball grid array module and method in which the modules and the devices carried thereby may be selectively interconnected by the addressing circuitry thus reducing the number of manufactured interconnections and providing a significant cost saving.

The typical stackable ball grid array module is constructed by having an electronic device mounted on the support member in what is known as a "chip first" configuration or interconnect process in which the vias pass all of the way through the substrate to the top surface. However, manufacturing advantages may be achieved by using a standard laminate support member and having the electronic device mounted in a "cavity-down" configuration.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
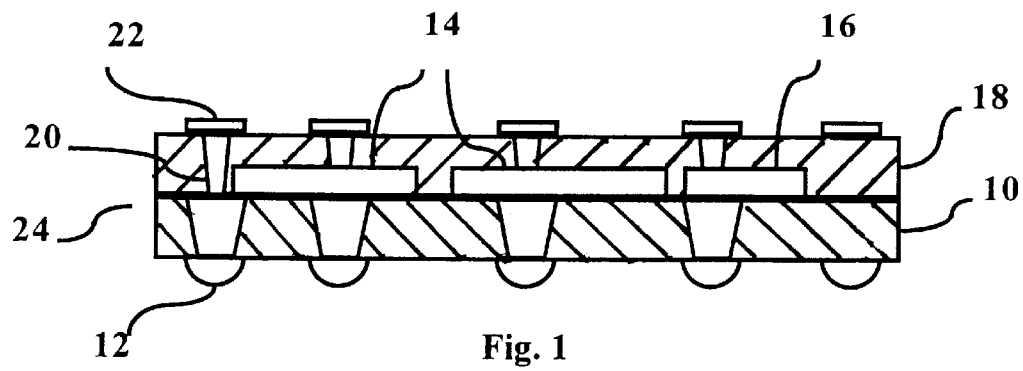
FIG. 1 is an elevation in partial section of a first embodiment of a single stackable ball grid array module of the present invention in a chip first configuration.

With reference to FIG. 1, a stackable ball grid array module 24 is illustrated as comprising a substantially planar nonconductive support member 10, a plurality of conductive balls 12, one or more electronic devices 14, a chip select decoder 16, an encapsulating layer 18, a plurality of conductive vias 20, and a plurality of conductive interconnect pads 22.

Support member 10 may be made from any suitable conventional heat transfer material. A plurality of conductive balls 12 are affixed to the bottom surface of support member 10, and one or more electronic devices 14 may be conventionally attached to the top surface of support member 10. A chip select decoder 16 may be attached to the top surface of support member 10 and may be electrically connected to the electronic devices 14 carried by the support member 10 in any suitable conventional manner. The electronic devices 14 may themselves be electrically connected to one another in such manner. However, not all the devices 14 need to be electrically connected to the chip select decoder 16, e.g., only those electronic devices 14 that need to communicate with devices outside the module may be electrically connected to the chip select decoder 16.

An encapsulating layer 18 may cover the upper surface of the support member 10, including the electronic devices 14 and the chip select decoder 16. Conductive vias 20 are formed through the encapsulating layer 18 and the support member 10 in any suitable conventional manner, e.g., by drilling holes through the layers, and filling the hole with electrically conductive material.

Each of the conductive vias 20 is desirably electrically connected to one of the conductive balls 12 and to one of the interconnect pads 22. The conductive vias 20 may be only electrically connected to the chip select decoder 16, and may not be directly connected to any of the electronic devices 14. However, in other embodiments of the invention some conductive vias 14 may be directly to electronic devices 14.

Figure 2:
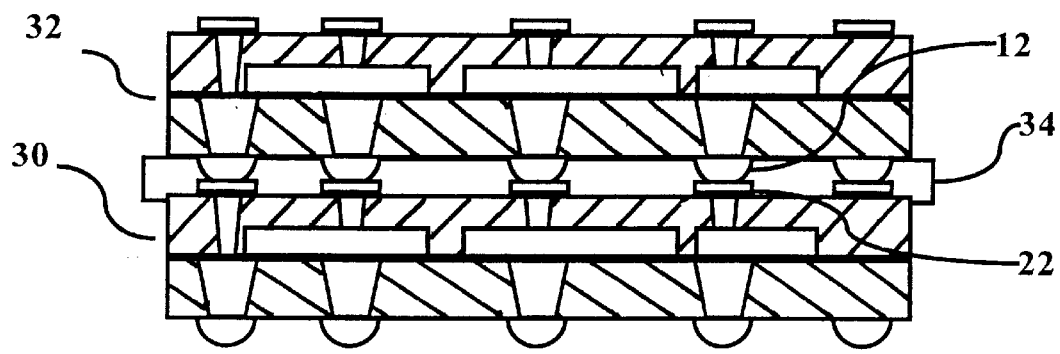
FIG. 2 is a side view in elevation of a stack of the modules of FIG. 1.

With reference to FIG. 2 where two stackable ball grid array modules of the type illustrated in FIG. 1 are stacked, a second module 32 is placed on top of first module 30. The first module 30 and second module 32 may or may not be identical, but significant cost savings may be achieved by the use of identical modules. The modules may have identical devices and/or identical physical dimensions.

A suitable heat transfer material 34, suitably isolated from the balls 12 and pads 22, may be placed between the two modules to improve cooling of the modules. However, the gap between the two modules need not be filled with a heat transfer material 34, so as to allow cooling by the passage of air between the modules.

The conductive balls 12 of the second module are aligned with, and are in electrical contact with, the interconnect pads 22 of the first module 30. The modules may be permanently affixed to each other, e.g., by soldering or using a conductive epoxy. This electrical contacts between the two modules forms interconnect lines or busses between the two modules so that the two modules can communicate.

As previously described with respect to FIG. 1, these interconnect lines incorporate the balls 12, conductive vias 20, and interconnect pads 22 for each of the connected modules. These interconnect lines are electrically connected to the chip select decoders 16 of their respective modules. By having the interconnect line electrically connect to the chip select decoders 16, the number of busses required for communication between the devices within the stackable ball grid array may be reduced. Instead of having a unique bus for each device on each module (e.g., 8 buses of 8 devices), the module of the present invention requires only 3 buses for 8 devices where the chip select decoders 16 are binary decoders. By using the chip select decoders 16, the total number of interconnect lines required in the array may thus be significantly reduced, with the devices communicating with each other through the interconnect lines and chip select decoders 16. Where not all of the interconnect lines need to be connected to every module, even greater communication flexibility is provided.

Figure 3:
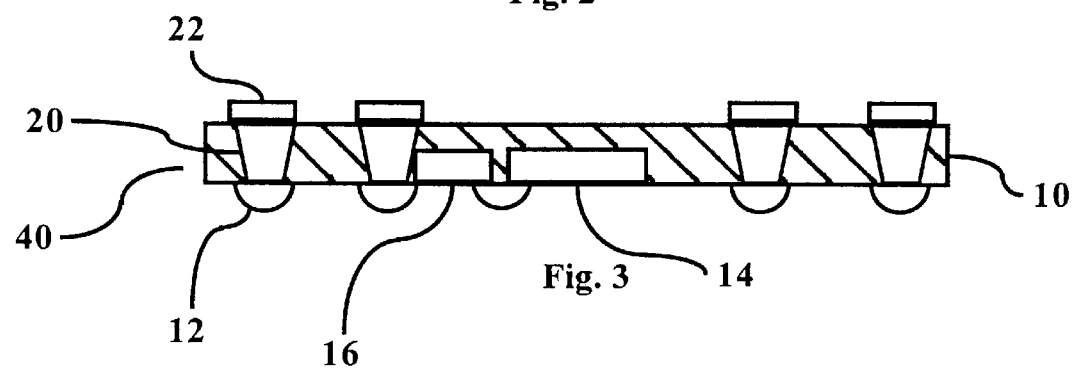
FIG. 3 is an elevation in partial section of a second embodiment of a stackable ball grid array module of the present invention in a cavity-down configuration.
Figure 4:
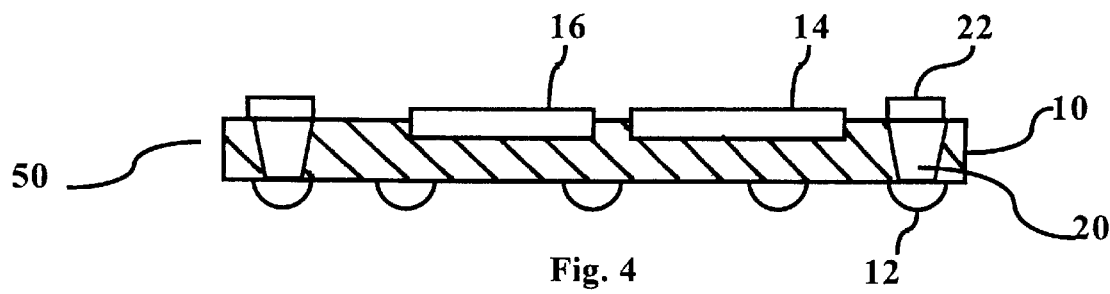
FIG. 4 is an elevation in partial section of a third embodiment of a stackable ball grid array module of the present invention.

FIG. 3 shows a stackable ball grid array module 40 constructed in a "cavity-down" configuration in which electronic devices 14 and the chip select decoder 16 are attached to the bottom surface of support member 10. This facilitates the use of a standard laminated circuit board interconnect.

As shown in FIG. 3, the encapsulating layer is not present, and the pads 22 may be mounted directly onto the conductive vias 20. Thus the vias 20 must be formed through the support member 10 only.

The module of the present invention may be constructed by creation of a laminate or ceramic substrate for the electronic devices using a ball grid array interconnect. Then the device(s) are mounted on the substrate, and the devices are connected using the "chips first" interconnect process. Vias may then be constructed above each ball and pass all of the way through the interconnect layer to the upper surface and interconnect pads added.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a stackable ball grid array module having:

a substantially planar nonconductive support member, a plurality of conductive balls affixed to the bottom surface of said support member, a plurality of conductive interconnect pads affixed to the top surface of said support member, a plurality of conductive vias through said support member each of said conductive vias electrically connecting one of said balls to one of said interconnect pads, and one or more electronic devices attached to said support member, the improvement comprising a chip select decoder carried by said support member in electrical contact with said electronic devices, said chip select decoder being electrically connected to selected ones of said vias so that the address capacity of said vias is increased by the capacity of said chip select decoder to decode.

2. The stackable ball grid array module of claim 1 further comprising a nonconductive encapsulating layer covering said electronic devices, said chip select decoder, and said support member except in the area of said interconnect pads.

3. The stackable ball grid array module of claim 1 wherein said support member is made from a heat transfer material.

4. The stackable ball grid array module of claim 1 further comprising a heat transfer layer carried by the top surface of said support member without covering said interconnect pads and in electrical isolation therefrom.

5. The stackable ball grid array module of claim 1 further comprising a heat transfer layer affixed to the bottom surface of said support member without covering said balls and in electrical isolation therefrom.

6. The stackable ball grid array module of claim 1 wherein said module is constructed in a "cavity-down" configuration.

7. The stackable ball grid array module of claim 1 wherein the number of electronic devices is two or more; and including means for electrically interconnecting selected ones of said electronic devices.

8. The stackable ball grid array module of claim 1 wherein selected said electronic devices are electrically connected to other selected said electronic devices.

9. The stackable ball grid array module of claim 1 wherein said module is a bottom module having an identical top module supported thereon so that one or more of the conductive balls of said top module are in electrical contact with one or more of said interconnect pads of said bottom module.

10. The stackable ball grid array of claim 9 further comprising a heat transfer layer carried between said top module and said bottom module.

11. In a stackable ball grid array module having:
a substantially planar nonconductive support member,
a plurality of conductive balls affixed to the bottom surface of said support member,
a plurality of conductive interconnect pads affixed to the top surface of said support member,
a plurality of conductive vias through said support member each of said conductive vias electrically connecting one of said balls to one of said interconnect pads, and
one or more electronic devices attached to said support member,
the improvement comprising a chip select decoder attached to said support member in electrical contact with said electronic devices and said vias so that at least one additional module may be stacked thereon and addressed without increasing the number of said vias.

12. A stackable ball grid array comprising:
a bottom module having a chip select decoder;
a top module having a chip select decoder, said top module being carried by said bottom module; and
one or more interconnect lines formed between said chip select decoders.

13. The stackable ball grid array of claim 12 further comprising a heat transfer layer carried between said top module and said bottom module in electrical isolation from said interconnect lines.

14. The stackable ball grid array of claim 12 wherein said top module is identical to said bottom module.

15. A method of manufacturing a stackable ball grid array module with less vias comprising the steps of:
(a) creating a substrate using a ball grid array interconnect;
(b) mounting M electronic devices on a flat surface of the substrate;
(c) mounting a chip select decoder on a flat surface of the substrate;
(d) electrically interconnecting the electronic devices and the chip select decoder;
(e) constructing N conductive vias through the substrate above each ball in the ball grid array where selected balls and selected conductive vias are electrically connected to the chip select decoder, and where N is less than M; and
(g) adding interconnect pads in electrical contact with the conductive vias.

16. The method of claim 15 wherein step (d) is a "chip first" interconnecting process.

17. The method of claim 15 wherein step (d) is a "cavity-down" interconnecting process.

18. The method of claim 15 further comprises the step of encapsulating the module.

19. A method of manufacturing a stackable ball grid array with less interconnect lines comprising the steps:
(a) creating a top module with L electronic devices and a chip select decoder;
(b) creating a bottom module with M electronic devices and a chip select decoder; and
(c) forming N interconnect lines between the modules by electrically connecting the top module with the bottom module where N is less than the sum of L and M.

20. The method of claim 19 further comprising the step of placing a heat transfer layer between the modules.

21. The method of claim 19 further comprising the step of soldering the modules together.

22. The method of claim 19 further comprising the step of gluing the modules together with a conductive epoxy.

23. A method of communicating from a chip select decoder to an electronic device in a stackable ball grid array module comprising the steps of:
(a) receiving a signal at the chip select decoder; and
(b) sending the signal from the chip select decoder to the addressed electronic device.

24. In a stackable ball grid array module having:
a substantially planar non-electrically conductive support member;
a plurality of electrically conductive balls affixed to the bottom surface of said support member;
a plurality of electrically conductive interconnect pads affixed to the top surface of said support member;
a plurality of electrically conductive vias through said support member, one or more of said vias electrically connecting one of said balls to one of said interconnect pads; and
one or more electronic devices supported by said support member;
the improvement wherein said support member comprises heat transfer material.

25. The stackable ball grid array module of claim 24 further comprising a chip select decoder supported by said support member in electrical contact with one or more of said electronic devices, said chip select decoder being electrically connected to selected ones of said vias so that the address capacity of said vias is increased by the capacity of the chip select decoders to decode.

26. The stackable ball grid array module of claim 24 further comprising a chip select decoder supported by said support member in electrical contact with one or more of said electronic devices and one or more of said vias so that at least one additional module may be stacked on said module and addressed without increasing the number of vias.

27. In a stackable ball grid array module having:
a substantially planar non-electrically conductive support member;
a plurality of electrically conductive balls affixed to the bottom surface of said support member;
a plurality of electrically conductive interconnect pads affixed to the top surface of said support member;
a plurality of electrically conductive vias through said support member, one or more of said vias electrically connecting one of said balls to one of said interconnect pads; and
one or more electronic devices supported by said support member;
the improvement comprising a heat transfer layer carried by the top surface of said support member without covering said interconnect pads and in electrical isolation therefrom.

28. The stackable ball grid array module of claim 27 further comprising a heat transfer layer affixed to the bottom surface of said support member without covering said balls and in electrical isolation therefrom.

29. In a stackable ball grid array module having:
- a substantially planar non-electrically conductive support member;
- a plurality of electrically conductive balls affixed to the bottom surface of said support member;
- a plurality of electrically conductive interconnect pads affixed to the top surface of said support member;
- a plurality of electrically conductive vias through said support member, one or more of said vias electrically connecting one of said balls to one of said interconnect pads; and
- one or more electronic devices supported by said support member;
- the improvement comprising a heat transfer layer affixed to the bottom surface of said support member without covering said balls and in electrical isolation therefrom.

30. A stackable ball grid array comprising a top module, a bottom module, one or more electrically conductive interconnects between said top module and said bottom module, and a heat transfer layer carried between said top module and said bottom module in electrical isolation from said interconnects.

31. The stackable ball grid array of claim 30 wherein each of said modules supports a chip select decoder thereon, said chip select decoders being electrically connected by one or more electrical interconnects.

32. A method of manufacturing a stackable ball array comprising the steps of:
- providing a bottom module having one or more electrical interconnect pads attached to the upper surface thereof;
- providing a top module having one or more conductive balls attached to the bottom surface thereof;
- supporting the top module on the bottom module so that one or more of the conductive balls attached to the top module are in electrical contact with one or more of the interconnecting pads attached to the bottom module; and
- providing a heat transfer layer carried between the top module and the bottom module.

33. The method of claim 32 wherein the top module and the bottom module each support a chip select decoder, the chip select decoders being electrically connected by one or more electrical interconnect lines, the heat transfer layer being electrically isolated from the electrical interconnect lines.

* * * * *